(12) United States Patent
Brandon et al.

(10) Patent No.: US 11,593,195 B2
(45) Date of Patent: Feb. 28, 2023

(54) CONFIGURABLE INTEGRATED CIRCUIT (IC) WITH CYCLIC REDUNDANCY CHECK (CRC) ARBITRATION

(71) Applicant: Texas Instruments Incorporated, Dallas, TX (US)

(72) Inventors: Kevin William Brandon, Plano, TX (US); Jacco van Oevelen, Niederaichbach (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/128,595

(22) Filed: Dec. 21, 2020

(65) Prior Publication Data

US 2021/0191805 A1 Jun. 24, 2021

Related U.S. Application Data

(60) Provisional application No. 62/951,800, filed on Dec. 20, 2019.

(51) Int. Cl.
| | |
|---|---|
| *G06F 11/00* | (2006.01) |
| *G08C 25/00* | (2006.01) |
| *H03M 13/00* | (2006.01) |
| *H04L 1/00* | (2006.01) |
| *G06F 11/10* | (2006.01) |
| *G11C 7/10* | (2006.01) |
| *G06F 11/30* | (2006.01) |

(52) U.S. Cl.
CPC ...... *G06F 11/1004* (2013.01); *G06F 11/1068* (2013.01); *G06F 11/3037* (2013.01); *G06F 11/3062* (2013.01); *G11C 7/1012* (2013.01)

(58) Field of Classification Search
CPC ............. G06F 11/1004; G06F 11/1068; G06F 11/3062; G06F 11/3037; G11C 7/1012
See application file for complete search history.

(56) References Cited

U.S. PATENT DOCUMENTS

| | | | |
|---|---|---|---|
| 9,384,086 B1 * | 7/2016 | Craddock | G06F 11/0772 |
| 2010/0185808 A1 * | 7/2010 | Yu | G06F 13/1684 |
| | | | 713/193 |
| 2014/0108703 A1 * | 4/2014 | Cohen | G06F 3/0655 |
| | | | 711/E12.008 |
| 2017/0031749 A1 * | 2/2017 | Gupta | G06F 11/1004 |

* cited by examiner

*Primary Examiner* — Samir W Rizk
(74) *Attorney, Agent, or Firm* — Ray A. King; Frank D. Cimino

(57) ABSTRACT

An integrated circuit (IC) includes: a storage having a storage interface and addressable bytes, the storage interface coupled to first and second sets of peripheral terminals; control circuitry having control circuitry inputs and control circuitry outputs, the control circuitry inputs coupled to the storage interface and configured to receive configuration bits provided by the storage responsive to a control circuitry update trigger, and the control circuitry outputs coupled to first and second sets of peripheral outputs; and a cyclic-redundancy check (CRC) engine coupled to the storage interface, the CRC engine configured to distinguish between purposeful updates to the data in the storage and bit errors in the data in the storage.

22 Claims, 4 Drawing Sheets

CONFIGURABLE INTEGRATED CIRCUIT (IC) WITH CYCLIC REDUNDANCY CHECK (CRC) ARBITRATION

CROSS-REFERENCE TO RELATED APPLICATION

This application claims priority to U.S. Provisional Application No. 62/951,800 filed Dec. 20, 2019, which is hereby incorporated by reference in its entirety.

BACKGROUND

As new electronic devices are developed and integrated circuit (IC) technology advances, new IC products are commercialized. Some example IC products use storage and bits of data to perform operations. In many such systems, which have specifications for functional safety, bit errors are a concern in volatile or non-volatile memory of ICs. This is because random bit errors can lead to erratic functionality on a system level. In one example, the memory is a register map that includes bits to configure certain functions or parameters of an IC. For example, a power management IC (PMIC) may use a register map with values to control one or more output voltages, where bit-errors in the register map can directly lead to a safety violation.

A cyclic redundancy check (CRC) on all the bits in memory is one technique for detecting such bit errors. But if the data in the memory is to be updated purposely, the checksum value must be recalculated in a short time-interval to detect bit errors quickly enough before the error can lead to a safety violation in the system. This challenge is manageable if a single source can update the data in the memory. However, if multiple sources attempt to update the data in the memory, then compliance becomes more difficult and complicated, because each source would need to track all data updates.

SUMMARY

In at least one example, an integrated circuit (IC) comprises: a first peripheral terminal adapted to be coupled to a communication terminal of a first peripheral; a first set of peripheral outputs adapted to be coupled to peripheral inputs of the first peripheral; a second peripheral terminal adapted to be coupled to a communication terminal of a second peripheral; and a second set of peripheral outputs adapted to be coupled to peripheral inputs of the second peripheral. In addition, the IC comprises a storage having a storage interface and addressable bytes, the storage interface coupled to the first and second peripheral terminals; control circuitry having control circuitry inputs and control circuitry outputs, the control circuitry inputs coupled to the storage interface and configured to receive configuration bits provided by the storage responsive to a control circuitry update trigger, and the control circuitry outputs coupled to the first and second sets of peripheral outputs; and a cyclic-redundancy check (CRC) engine coupled to the storage interface, the CRC engine configured to distinguish between purposeful updates to the data in the storage and bit errors in the data in the storage.

In another example, a system comprises: a first peripheral having a first set of inputs and a first communication terminal; a second peripheral having a second set of inputs and a second communication terminal; and an integrated circuit (IC). The IC includes: a first set of peripheral outputs coupled to the first set of inputs; a first peripheral terminal coupled to the first communication terminal; a second set of peripheral outputs coupled to the second set of inputs; a second peripheral terminal coupled to the second communication terminal; and a storage having a storage interface and addressable bytes, the storage interface coupled to the first and second peripheral terminals. In addition, the IC includes: control circuitry having control circuitry inputs and control circuitry outputs, the control circuitry inputs coupled to the storage interface and configured to receive configuration bits provided by the storage responsive to a control circuitry update trigger, and the control circuitry outputs coupled to the first and second sets of peripheral outputs; and a cyclic-redundancy check (CRC) engine coupled to the storage interface. The CRC engine is configured to: perform current data CRC checksum operations; track internal write requests to the storage, external write requests to the storage from the first peripheral, and external write requests to the storage from the second peripheral; and perform updated data CRC checksum operations responsive to any tracked write requests.

In another example, a method comprises performing, by an integrated circuit (IC), current data CRC checksum operations for addressable bytes of a storage of the IC. The method also comprises tracking, by the IC, internal write requests to the storage, external write requests to the storage from a first peripheral, and external write requests to the storage from a second peripheral. The method further comprises performing, by the IC, updated data CRC checksum operations for the addressable bytes of the storage for each tracked write request within a target update interval. The method further comprises providing, by the storage, configuration bits to control circuitry of the IC responsive to a control circuitry update trigger and updated data CRC checksums being valid.

DETAILED DESCRIPTION

In this description, an integrated circuit (IC) has storage and a cyclic redundancy check (CRC) engine. The CRC engine is configured to perform CRC operations to validate the data in the storage before the data (e.g., configuration bits or status bits) are used by internal components of the IC or external peripherals coupled to the IC. Moreover, the CRC engine is configured to arbitrate between internal write requests to the storage, and external write requests from peripherals coupled to the IC. With the described CRC engine, the IC tracks and handles write requests to the storage from internal and/or external sources, while ensuring related CRC checksum validity of each update before a target update interval expires. In this manner, validity is ensured of the data provided to internal components of the IC and/or external peripherals coupled to the IC, which is mandated in safety applications.

Figure 1:
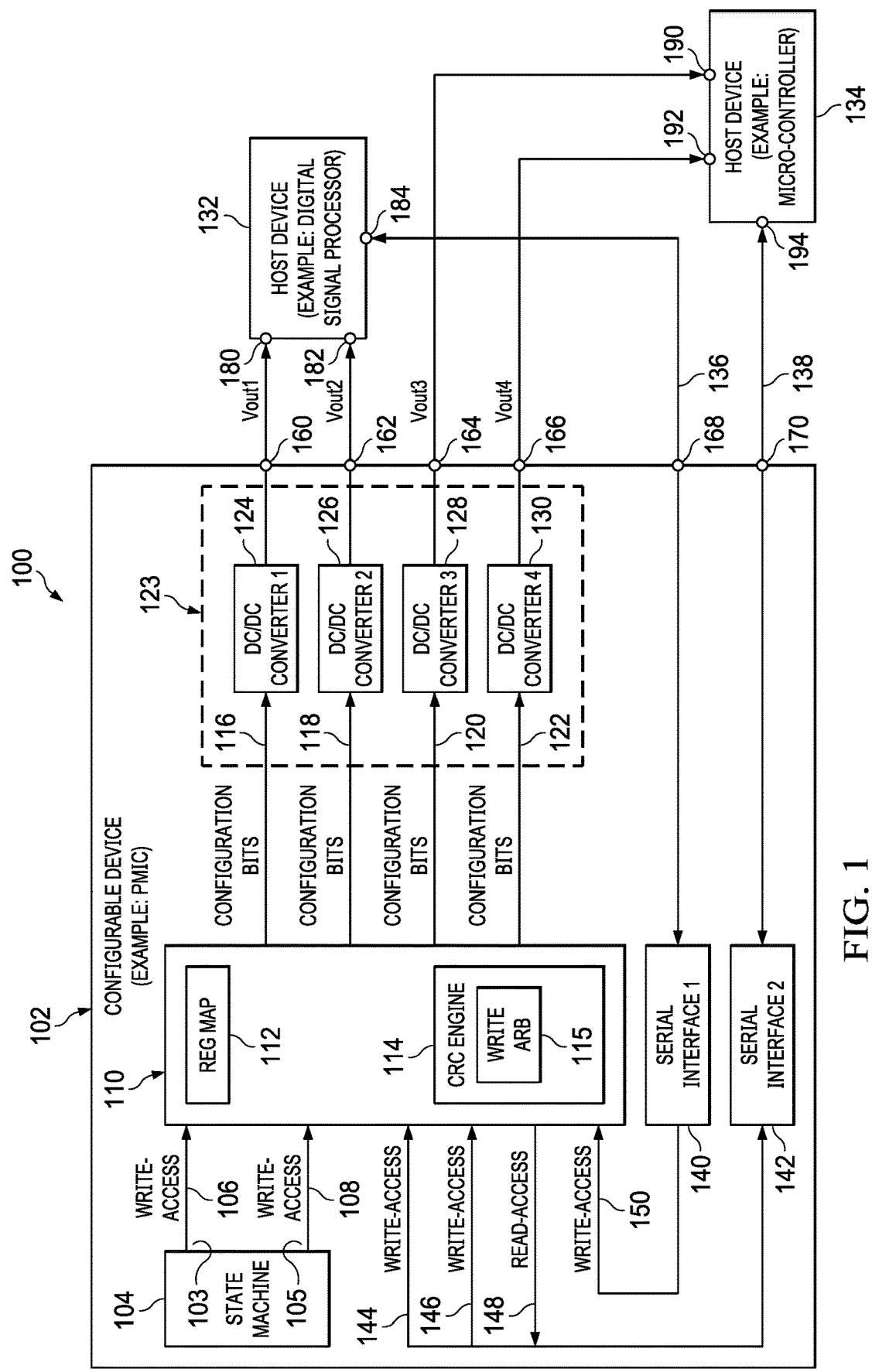
FIG. 1 is a block diagram of a subsystem of an example embodiment.

FIG. 1 is a block diagram of a subsystem 100 of an example embodiment. In one example, the subsystem 100 is part of an advanced driver assistance system (ADAS)

domain controller system. In other examples, the subsystem 100 is part of another system. In the example of FIG. 1, the subsystem 100 includes an IC 102, referred to as a configurable device, such as a power management IC (PMIC), a configurable sensor-based device, a configurable driver device, or a configurable actuator controller device. As shown, the IC 102 includes secure storage logic 110 configured to store and validate configuration bits, status bits, or other data used by IC 102 and/or peripherals coupled to the IC 102. In the example embodiment of FIG. 1, the peripherals of the subsystem 100 include a first host device 132 (e.g., a digital signal processor or DSP) and a second host device 134 (such as a microcontroller). In other example embodiments, the peripherals vary.

As shown, the secure storage logic 110 includes a register map 112 or other storage interface with addressable bytes. Also, the secure storage logic 110 includes a CRC engine 114 having write arbitration logic 115. In operation, the CRC engine 114 is configured to perform current data CRC checksum operations on addressable bytes of the register map 112. The CRC engine 114 is further configured to perform updated data CRC checksum operations on addressable bytes of the register map 112 responsive to any writes handled by the write arbitration logic 115. In some example embodiments, write request sources for the IC 102 include internal write request sources (e.g., the state machine 104 or a related communication interface), or external write request sources (e.g., the first host device 132 and the second host device 134). With the write arbitration logic 115, the CRC engine 114 arbitrates internal and external write requests, and performs related updated data CRC checksum operations for each write request within a target update interval.

In some example embodiments, a target update interface of less than 1 us is acceptable, which is sufficient time to complete an 8-bit CRC of a 128-bit segment within a single 20 Mhz clock cycle. In one example, for a 128-bit segment and byte-wise CRC calculation, the calculation takes 16 clock-cycles. Accordingly, for a system clock frequency of 20 MHz, the CRC calculation would take 16/20 MHz=800 ns. The secure storage logic 110 thus provides the potential for a register write to occur every cycle, where each write involves an update of a 128-bit segment CRC. In some examples, the secure storage logic 110 includes two 128-bit CRC engines (e.g., the current data CRC engine logic 324 and the updated data CRC engine logic 328), which operate in parallel during writes. These parallel CRC engines ensure the integrity of a segment and update a segment 8-bit CRC simultaneously. Separately, at power up, a static 16-bit CRC calculation occurs over the entire memory space at a rate of 20 MHz for every 8-bits (i.e., 16 clocks per segment). This serves to check the initial integrity of the register bits, while simultaneously priming (initial computation) the 8-bit CRC values of the 16 128-bit segments.

By performing the updated data CRC checksum operations for each write request within a target update interval, data validity is ensured, while handling dynamic update requests. For an ADAS domain controller system or other safety risk scenarios, the described CRC and write arbitration operations ensure that incorrect data (e.g., configuration bits, status bits, or other data) are disallowed against propagating in the system. For the subsystem 100, incorrect data or outdated data can possibly lead to failure of the system or hazardous operations.

In some example embodiments, configuration bits stored by the register map 112 are provided to control circuitry 123 to adjust operations of the control circuitry 123. In the example of FIG. 1, the control circuitry 123 includes direct-current (DC)-DC converters 124, 126, 128 and 130, which have adjustable output voltages responsive to configuration bits provided by the register map 112. The first DC-DC converter 124 and the second DC-DC converter 126 are a first set of voltage converters for the first host device 132. The third DC-DC converter 128 and the fourth DC-DC converter 130 are a second set of voltage converters for the second host device 134. In operation, the first DC-DC converter 124 provides Vout1 to the first host device 132, the second DC-DC converter 126 provides Vout2 to the first host device 132, the third DC-DC converter 128 provides Vout3 to the second host device 134, and the fourth DC-DC converter 130 provides Vout4 to the second host device 134. During operations of the subsystem 100, the values of Vout1-Vout4 are configurable responsive to updates to the related configuration bits stored in the register map 112. Configuration bit updates are performed, such as responsive to internal write requests (e.g., from the state machine 104 or other internal components of the IC) or external write requests (e.g., from the first host device 132 and/or the second host device 134).

Responsive to each write request, the CRC engine 114 performs current data CRC checksum operations and updated data CRC checksum operations to ensure the data stored in the register map 112 is valid before after each update. Even if no write requests are pending, the CRC engine 114 performs current data CRC checksum operations to ensure the data stored in the register map 112 are valid. With the CRC engine 114 and write arbitration logic 115, multiple write requests may be handled during a target update interval, while ensuring updated data validity. After the target update interval is complete, no additional write requests are processed until the next update interval, and the validated configuration bits are provided to the control circuitry 123. If current data CRC checksums or updated data CRC checksums indicate a configuration bit error, then the IC 102 shuts down or performs another error response.

In a similar way, status bits of the IC 102 (stored by the register map 112) can be updated and validated. Such status bits are provided to internal components of the IC and/or peripherals coupled to the IC 102 (e.g., the first and second host devices 132 and 134). After the target update interval is complete, no additional write requests to update status bits are processed until the next update interval, and the validated status bits are provided upon request or during each status cycle. If current data CRC checksums or updated data CRC checksums indicate a status bit error, then the IC 102 shuts down or performs another error response. In a similar way, other data stored in the register map 112 can be used or updated while ensuring validity, so errors are not propagated and/or do not cause undesired operations of the IC 102, peripherals (e.g., the first host device 132 and/or the second host device 134), the subsystem 100, or a related system.

In FIG. 1, the IC 102 includes various terminals, including terminals 160, 162, 164, 166, 168 and 170. The terminals 160 and 162 are a first set of peripheral outputs adapted to be coupled to respective inputs 180 and 182 of the first host device 132. The terminals 164 and 166 are a second set of peripheral outputs adapted to be coupled to respective inputs 190 and 192 of the second host device 134. The terminal 168 is a communication interface adapted to be coupled to a communication terminal 184 of the first host device 132. The terminal 170 is a communication interface adapted to be coupled to a communication terminal 194 of the second host device 134. In the example of FIG. 1, the terminals 160, 162, 164 and 166 provide Vout1-Vout4 described herein. In other example examples, the terminals 160, 162, 164 and 166 provide drive signals, sensor-based signals, actuator control signals, or other signals, depending on the functionality of the control circuitry 123. The terminal 168 is used for communications 136 (e.g., write requests to update configuration bits stored by the register map 112 and/or read requests to receive status bits stored by the register map 112) between the IC 102 and the first host device 132. In some example embodiments, the terminal 168 is a serial peripheral interface (SPI) terminal or other serial communication terminal. The terminal 170 is used for communications 138 (e.g., write requests to update configuration bits stored by the register map 112 and/or read requests to receive status bits stored by the register map 112) between the IC 102 and the second host device 134. In some example embodiments, the terminal 170 is an SPI terminal or other serial communication terminal.

In FIG. 1, the terminals 168 and 170 are coupled to the secure storage logic 110 of the IC 102 via respective serial interfaces 140 and 142. In some example embodiments, the serial interface 140 supports write-accesses 150 to the secure storage logic 110 to enable configuring Vout1 and Vout2, or other configurable features of the IC 102. The serial interface 142 supports write-accesses 144 to the secure storage logic 110 to enable configuring Vout3 and Vout4, or other configurable features of the IC 102. Also, the serial interface 142 supports write-accesses 146 to the secure storage logic 110 to clear status bits of the IC 102. Moreover, the serial interface 142 supports read-accesses 148 to the secure storage logic 110 to transfer status bits of the IC 102 to the second host device 134.

As shown, the IC 102 includes a state machine 104 coupled to the secure storage logic 110. In operation, the state machine 104 enables write-accesses 106 to the secure storage logic 110 for setting status bits of the IC 102. The state machine 104 enables write-accesses 106 to the secure storage logic 110 for configuring Vout1-Vout4, or other configurable features of the IC 102. In some example embodiments, internal write-requests or write accesses (e.g., the write accesses 106 and 108) to the secure storage logic 110 are handled by a serial interface (not shown) between internal components (e.g., the state machine 104) and the secure storage logic 110. In the example of FIG. 1, the secure storage logic 110 includes a storage interface and addressable bytes compatible with the read-accesses 148 and write-accesses 106, 108, 144, 146 and 150 described herein. In one example, the register map 112 includes the storage interface and addressable bytes. In other examples, the storage interface and addressable bytes include the register map 112 and additional logic. In some example embodiments, write-requests are queued by the write arbitration logic 115, and fed to the storage interface of the register map. Similarly, read-requests are queued by a read arbiter, which is part of the storage interface of the register map 112. The storage interface of the register map 112 ensures that each read/write access is directed to the correct segment by taking the x-MSB of the address as segment selection, and using the y-LSB of the address to select the correct byte in the segment.

In addition to the read-accesses 148 and write-accesses 106, 108, 144, 146 and 150, the secure storage logic 110 provides configuration bits 116 to the control circuitry 123 to configure Vout1. The secure storage logic 110 provides configuration bits 118 to the control circuitry 123 to configure Vout2. Also, the secure storage logic 110 provides configuration bits 120 to the control circuitry 123 to configure Vout3. Moreover, the secure storage logic 110 provides configuration bits 120 to the control circuitry 123 to configure Vout4.

Some example embodiments, such as the subsystem 100, enable a configurable device (e.g., the IC 102) to track all purposeful data updates, verify them, and recalculate the checksum value based on a merge of the current not-to-be updated data bytes and the to-be-updated data-byte. In parallel with this new checksum value calculation, the integrity of the current data is verified by calculating the current checksum and comparing with its previously calculated checksum (stored in a CRC register). After this calculation cycle, the new checksum value is stored in the CRC register and accordingly becomes the current CRC value.

On the next calculation cycle, the checksum is calculated on the new data (with the new data-byte) and compared with the current CRC value, which was calculated in the previous step based on the merge of the not-to-be updated data bytes and the to-be-updated data-byte. In this way, the described solution automatically checks whether the actual data update in the master register map is correct. Also, the described solution identifies and reports bit errors at any random moment, with the limits of the chosen CRC hamming distance and the time interval for the CRC. In some example embodiments, the described technique performs a CRC on 128 bits within one clock-cycle, for a chosen Hamming Distance of 3.

Figure 2:
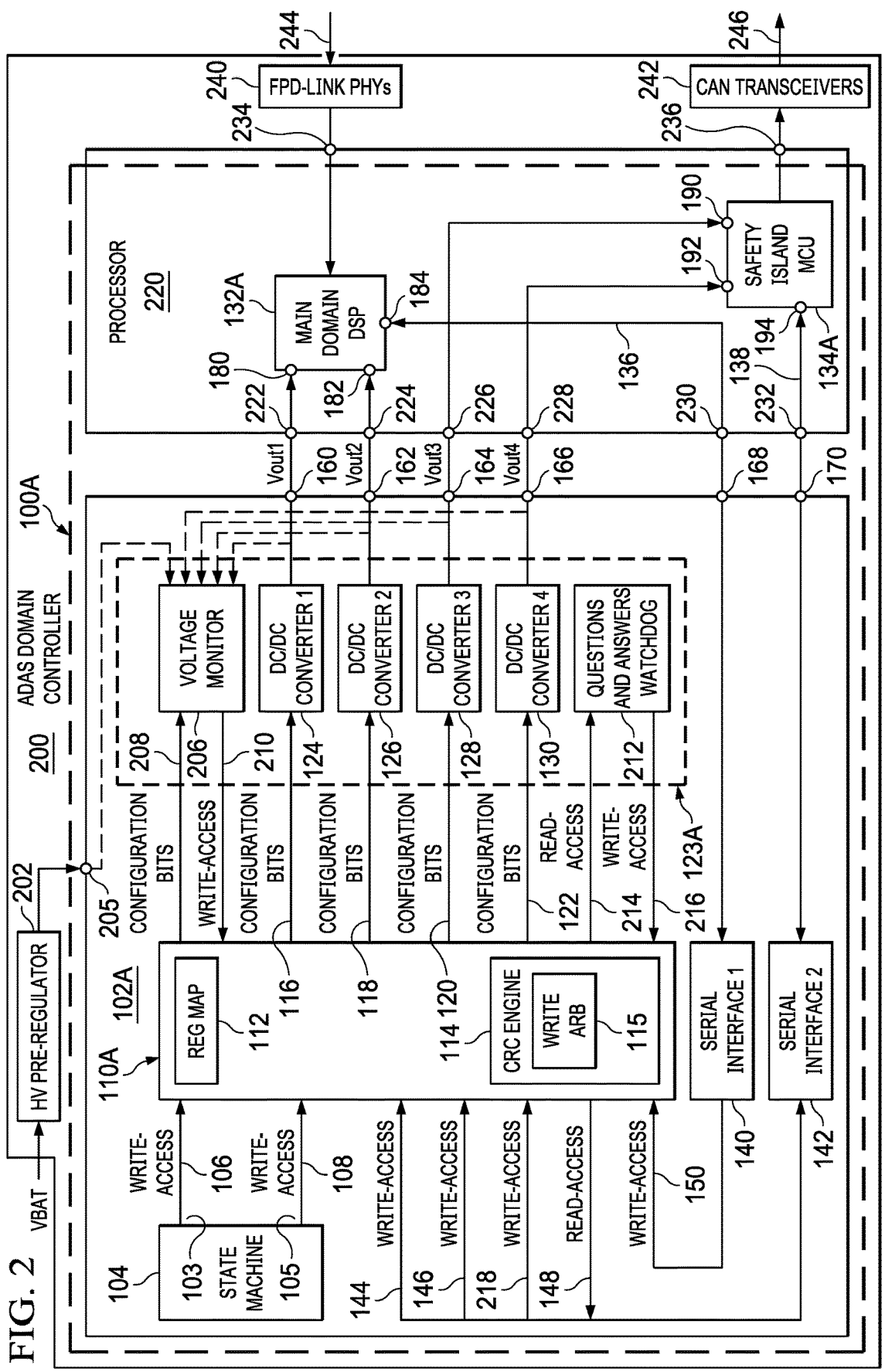
FIG. 2 is a block diagram of a system and subsystem of an example embodiment.

FIG. 2 is a block diagram of a system 200 and subsystem 100A (an example of the subsystem 100 of FIG. 1) of an example embodiment. In the example of FIG. 2, the system 200 is an ADAS domain controller. As shown, the system 200 includes a subsystem 100A having an IC 102A (an example of the IC 102 of FIG. 1) coupled to a first host device 132A (an example of the first host device 132 of FIG. 1) and a second host device 134A (an example of the second host device 134 of FIG. 1). Specifically, the first host device 132A is a main domain DSP, and the second host device 134A is a safety island microcontroller (MCU).

In the example of FIG. 2, the first and second host devices 132A and 134A are part of a processor 220 coupled to the IC 102A. In that example, the processor 220 includes various terminals 222, 224, 226, 228, 230 and 232. Specifically, the terminal 222 of the processor 220 couples the terminal 160 of the IC 102A to the input 280 of the first host device 132A. The terminal 224 of the processor 220 couples the terminal 162 of the IC 102A to the input 182 of the first host device 132A. The terminal 226 of the processor 220 couples the terminal 164 of the IC 102A to the input 190 of the second host device 134A. The terminal 228 of the processor 220 couples the terminal 166 of the IC 102A to the input 192 of the second host device 134A. The terminal 230 of the processor 230 couples the terminal 168 of the IC 102A to the communication terminal 184 of the first host device 132A. Finally, the terminal 232 of the processor 230 couples the terminal 190 of the IC 102A to the communication terminal 194 of the second host device 134A. Regardless of the particular arrangement of the first and second host devices 132A and 134A, the communications 136 and 138 and related operations are supported by the subsystem 100A.

In the example of FIG. 2, the IC 102A includes many of the same components and signaling described for the IC 102 of FIG. 1. Specifically, example components of the IC 102A include the state machine 104, secure storage logic 110A (an example of the secure storage logic 110 of FIG. 1) having register map 112 and CRC engine 114, the serial interfaces 140 and 142, the DC-DC converters 124, 126, 128 and 130, and the terminals 160, 162, 164, 166, 168 and 170. Example signaling of the IC 102A includes the write-accesses 106 and 108, the write-accesses 144, 146 and 150, the read-accesses 148, and the configurations bits 116, 118, 120 and 122.

For the IC 102A of FIG. 2, the serial interface 142 supports write-accesses 218 to enable questions and answer (Q&A) watchdog answers. Also, the control circuitry 123A (an example of the control circuitry 123 of FIG. 1) includes a voltage monitor 206 and Q&A watchdog logic 212 coupled to the secure storage logic 110A. In some example embodiments, the voltage monitor 206 receives configuration bits for its monitoring operations from the secure storage logic 110A. The voltage monitor 206 is configured to perform write-accesses 210 to the secure storage logic 110A to set related status bits. The Q&A watchdog logic 212 is configured to perform write-accesses 216 to the secure storage logic 110A for watchdog questions.

In some example embodiments, the Q&A watchdog logic 212 supervises correct software operation on the Safety Island MCU. To check correct software sequence and timing, the Safety Island MCU reads the question generated by the Q&A watchdog logic 212 and stored in the register map 112. The Safety Island MCU sends the correct answers (corresponding to the generated question) to the Q&A watchdog logic 212 by writing the answer bytes to the register map 112. In some example embodiments, the Q&A watchdog logic 212 expects a series of answers (e.g., 4 answers) in correct sequence and timing for each generated question. In that case, the register map 112 includes configuration data for the Q&A watchdog logic 212, such as time-intervals in which all answers must be received, and the polynomial and seed values for the question-generation.

As shown, the IC 102A includes another terminal 205 coupled a high-voltage (HV) pre-regulator circuit 202 of the system 200. In operation, the HV pre-regulator circuit 202 is configured to convert a battery voltage (VBAT) to another voltage level for use by the IC 102A. Also, the processor 220 includes another terminal 234 coupled to flat panel display (FDP)—link physical layers (PHYs) 240. In operation, the FDP-link PHYs 240 are configured to handle raw camera data 244 (e.g., from remove camera modules) and provide the raw camera data 244 or related data to the processor 220. Further, the processor 220 includes another terminal 236 coupled to controller area network (CAN) transceivers 242. As shown, the CAN transceivers 242 are coupled to a CAN bus 246. In operation, the processor 220 communicates with the CAN transceivers 242 to convey decision data via the CAN bus 246 for remote electronic control unit (ECUs) of a vehicle, such as ECUs for braking, electrical power steering, cruise control, or other ECUs.

Figure 3:
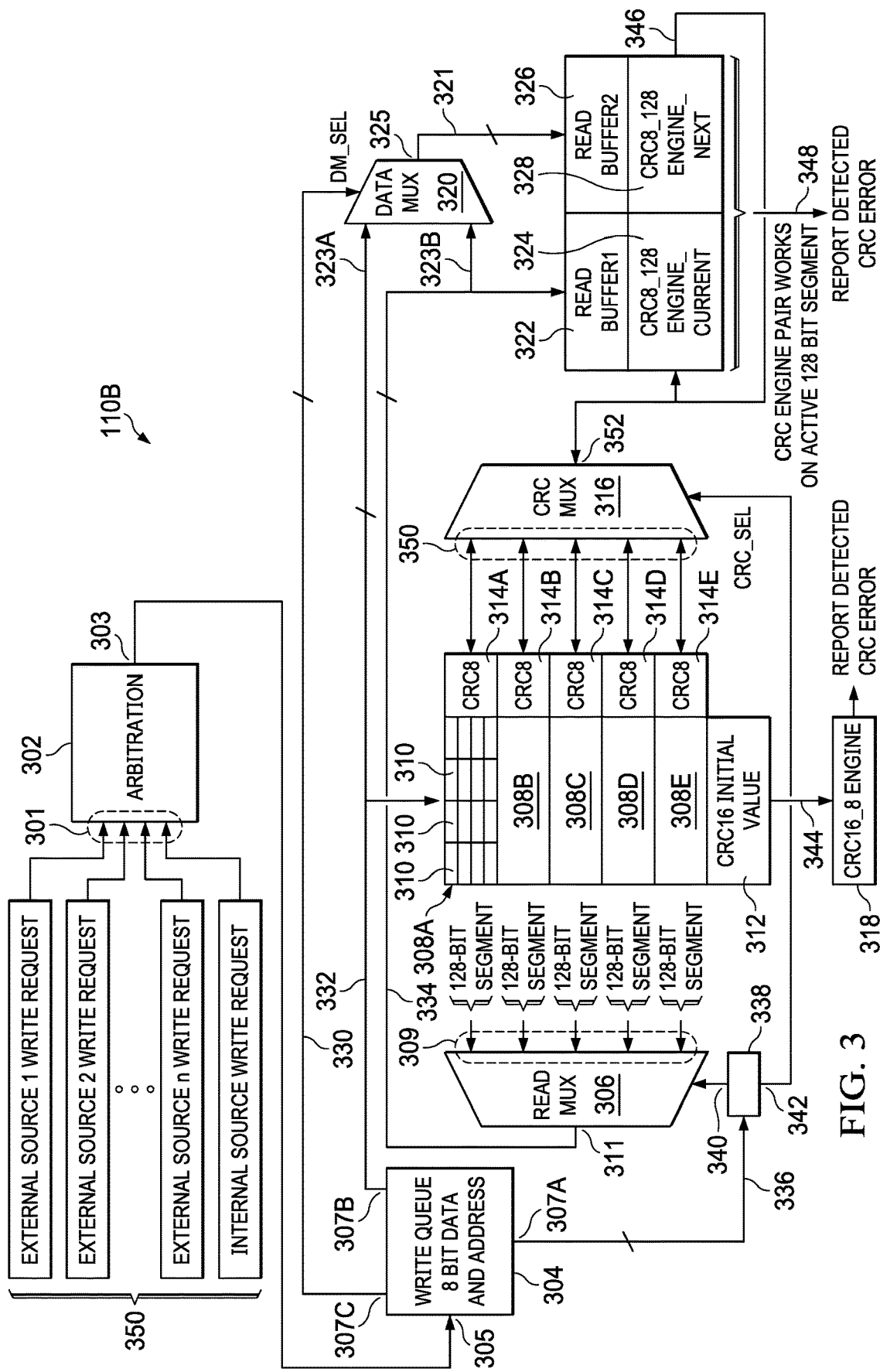
FIG. 3 is a schematic diagram of secure storage logic of an example embodiment.

FIG. 3 is a schematic diagram of secure storage logic 1106 (an example of the secure storage logic 110 of FIG. 1, or the secure storage logic 110A of FIG. 2) of an example embodiment. As shown, the secure storage logic 1106 includes register map segments 308A-308E. Each of the register map segments 308A-308E is divided into addressable bytes 310. The secure storage logic 1106 includes components of a CRC engine (e.g., the CRC engine 114 of FIG. 1), the CRC engine components including arbitration logic 302, a write queue 305, a read multiplexer 306, an CRC check initial value 312, CRC logic 314A-314E, a CRC multiplexer 316, CRC engine logic 318, a data multiplexer 320, read buffers 322 and 326, current data CRC engine logic 324, and updated data CRC engine logic 328 in the arrangement shown.

In the example of FIG. 3, the CRC engine components are coupled to and interact with a register map (e.g., register map segments 308A-308E) or a related storage interface. In operation, the CRC engine of FIG. 3 is configured to distinguish between purposeful updates to the data in the register map segments 308A-308E and bit errors in the data in the register map segments 308A-308E. As shown, the CRC engine components of the secure storage logic 1106 include the arbitration logic 302, which has inputs 301 and an arbitration logic output 303. In some example embodiments, the arbitration logic inputs 301 are coupled to a first peripheral terminal (e.g., the terminal 168 of FIGS. 1 and 2), a second peripheral terminal (e.g., the terminal 170 of FIGS. 1 and 2), and an internal write request source (e.g., the state machine 104 of FIGS. 1 and 2). The arbitration logic 302 is configured to provide a write request at the arbitration logic output 303 responsive to arbitration between write requests 350, which include internal write requests from the internal write request source, external write requests from the first peripheral, and external write requests from the second peripheral.

As shown, the write queue 304 has a write queue input 305 coupled to the arbitration logic output 303. The write queue includes a first write queue output 307A, a second write queue output 307B, and a third write queue output 307C. In the example embodiment of FIG. 3, the CRC engine components of the secure storage logic 1106 include a read multiplexer 306 having read multiplexer inputs 309, a read multiplexer control input (RM_SEL), and a read multiplexer output 311. As shown, the read multiplexer inputs 309 are coupled to the register map segments 308A-308E or a related storage interface. The CRC engine components of the secure storage logic 1106 include a data multiplexer 320 having a first data multiplexer input 323A, a second data multiplexer input 323B, a data multiplexer control input (DM_SEL), and a data multiplexer output 321. The first data multiplexer input 323A is coupled to a second write queue output 307B, the second data multiplexer input 323B is coupled to the read multiplexer output 311, and the data multiplexer control input is coupled to a write queue output 307A.

In the example of FIG. 3, the CRC logic 314A-314E is coupled to the register map segments 308A-308E or a related storage interface. The CRC logic 314A-314E is configured to provide a CRC checksum value for each of the addressable bytes 310. In some example embodiments, a CRC multiplexer 316 includes CRC multiplexer inputs 350, a CRC multiplexer output 352, and a CRC multiplexer control input (CRC_SEL). As shown, the CRC multiplexer inputs 350 are coupled to the CRC logic 314A-314E. Also, as shown, the CRC engine of the secure storage logic 1106 has multiplexer control circuitry 338, and the write queue 304 includes or is coupled to the multiplexer control circuitry 338. Accordingly, the write queue 304 and/or the multiplexer control circuitry 338 has a set of multiplexer control outputs coupled to the read multiplexer control input (RM_SEL), the CRC multiplexer control input (CRC_SEL), and the data multiplexer control input (DM_SEL). Specifically, the multiplexer control output 340 is coupled to RM_SEL, the multiplexer control output 342 is coupled to CRC_SEL, and the write queue output 307A is coupled to DM_SEL.

In some example embodiments, the CRC engine components of the secure storage logic 1106 include current data CRC engine logic 324 coupled to the CRC multiplexer output 352 and the read multiplexer output 311. The current data CRC engine logic 324 includes or is coupled to a first buffer 322 configured to store current data CRC checksum values. The CRC engine components of the secure storage logic 1106 also includes updated data CRC engine logic 328 coupled to the CRC multiplexer output 352 and the data multiplexer output 325. The updated data CRC engine logic 328 includes or is coupled to a second buffer 326 configured to store updated data CRC checksum values. During CRC operations, the updated data CRC engine logic 328 operates in parallel with the current data CRC engine logic 324. For comparison, the current data CRC engine logic 324 processes only the current data without the new data byte (from data line 323B), while the updated data CRC engine logic 328 processes the current data but with one byte replaced by the new to-be-written data (from the data multiplexer output 325). At the end of both CRC calculations, if the CRC engine logic 324 confirms that the current data without the new byte has no errors, then the CRC value calculated by CRC engine logic 328 becomes the new CRC value at CRC engine output 346. The CRC multiplexer 316 will put this new CRC value in the correct portion of the CRC logic 314A-314E.

As described above, the current data CRC engine logic 324 and the updated data CRC engine logic 328 operate in parallel. After both current data CRC engine logic 324 and the updated data CRC engine logic 328 have completed their calculations, the current data CRC engine logic 324 confirms that no data corruption exists in the current data. After this confirmation from the current data CRC engine logic 324, the CRC value from the updated data CRC engine logic 328 becomes the new CRC value, which is to be used for the next CRC calculation cycles. These next CRC calculation cycles are performed by the current data CRC engine logic 324. Accordingly, the current data CRC engine logic 324 performs the CRC check on the data with respect to the current CRC value stored in the segment, whereas the updated data CRC engine logic 328 calculates the new CRC value. The CRC check (performed by the current data CRC engine logic 324) and new CRC-value calculation (performed by the updated data CRC engine logic 328) run in parallel. After the CRC check confirms that the current data are not corrupted, the newly calculated CRC value is stored back into the segment.

Performing the CRC-check and the new CRC-value calculation in parallel saves time, in terms of calculation time (before that data update is confirmed to be valid) and by reducing the amount of time during which the to-be-updated segment would be exposed to undetectable bit-errors. In this example, the target update interval is less than 1 us for an example implementation that has CRC8 for each 128-bit segment and a system clock of 20 MHz. A sufficiently small target update interval is important if the register map's memory type is susceptible to transient faults caused by cosmic radiation. If the CRC-check and the new CRC-value calculation were performed sequentially rather than in parallel, then a data corruption during this new CRC calculation would not be detected. Accordingly, by performing the CRC-check on the current data and the new CRC-value calculation in parallel, a lower risk exists of data corruption to the new inserted data. In some example embodiments, the logic for each new data byte insertion (e.g., the write arbitration logic 302, the write-queue 304, the read multiplexer 306, the data multiplexer 320, and the CRC multiplexer 316) is covered by logic built-in self-test (BIST) operations at power-up to significantly reduce the risk of data corruption.

In some example embodiments, current data CRC checksum operations (of the current data CRC engine logic 324, write request operations, and updated data CRC checksum operations of the updated data CRC engine logic 328) are performed within a target update interval. In some example embodiments, the secure storage logic 1106 is part of a PMIC or other IC having control circuitry (e.g., the control circuitry 123 of FIG. 1, or the control circuitry 123A of FIG. 2). In one example embodiment, the control circuitry includes a first set of voltage converters (e.g., the DC-DC converters 124 and 126) for a first peripheral (e.g., the first host device 132 of FIG. 1). In one example embodiment, the control circuitry includes a second set of voltage converters (e.g., the DC-DC converters 128 and 130) for a second peripheral (e.g., the second host device 134 of FIG. 1). In operation, the first and second sets of voltage converters are configured to adjust respective output voltages (e.g., Vout1-Vout4 of FIG. 1) responsive to configuration bits (e.g., configuration bits 116, 118, 120, 122 of FIG. 1) provided by addressable bytes of the storage (e.g., register map 112 of FIG. 1). In other example embodiments, the control circuitry includes a configurable sensor responsive to configuration bits from the storage. In other example embodiments, the control circuitry includes a configurable driver or actuator controller responsive to configuration bits from the storage.

In some example embodiments, an IC having the secure storage logic 1106 includes a state machine (e.g., the state machine 104 of FIG. 1) having state machine outputs 103 and 105 coupled to the register map segments 308A-308E or a related storage interface. The state machine 102 is configured to provide status bits and configuration bits to the storage interface, or to clear status bits and configuration bits. In one example, the state machine 102 is configured to set interrupt status bits in the register map responsive to corresponding error input signals within a target time interval (e.g., 10 us). An example "DCDC1_INT" interrupt status bit indicates that the voltage monitor 206 detects a voltage error at the terminal 160. In another example, the state machine 102 is configured to clear enable bits in the register map responsive to corresponding error input signals within a target time interval (e.g., 10 us). An example clear enable bit operation involves a "clear DC/DC1_EN" bit, which is performed if the voltage monitor 206 detects a voltage error on terminal 160. In another example, the state machine 102 is configured to write enable bits in the register map to enable DC/DC Converters 1 to 4 to perform operations for a desired sequence and timing (e.g., at the moment the voltage on terminal 205 reaches a minimum voltage level for power-up). In another example, the state machine 102 is configured to write configuration bits to the voltage monitor 206 and the DC/DC Converter 1. In another example, the state machine 102 is configured to clear enable bits for DC/DC converters 2 to 4 responsive to input stimulus from another pin (e.g., a general purpose input/output or "GPIO" pin). In another example, the state machine 102 is configured to perform suspend-to-RAM state operations, in which: only one supply rail for the RAM of the processor 220 is kept enabled, but with a lower voltage; and other supply rails are disabled to reduce power consumption. In some example embodiments, the secure storage logic 1106 is part of a subsystem (e.g., the subsystem 100 of FIG. 1) or a system (e.g., the system 200 of FIG. 1), such as ADAS domain controller, that ensures validity of and updates to configuration bits, status bits, and/or other data used by the system.

In some example embodiments, an IC (e.g., the IC 102 of FIG. 1, or the IC 102A of FIG. 2) is configured to: provide configuration bits (e.g., configuration bits 116, 118, 120 and 122 of FIGS. 1 and 2) from addressable bytes of the storage (e.g., the register map 112 of FIGS. 1 and 2) to the control circuitry (e.g., the control circuitry 123 of FIG. 1, or the control circuitry 123A of FIG. 2) responsive to a control circuitry update trigger for the control circuitry, valid current CRC checksum results, and valid updated current CRC checksum results if any. In some example embodiments, the control circuitry update trigger is a scheduled update, an update responsive to a write operation, or other trigger. In some example embodiments, the IC provides status bits (e.g., the status bits resulting from read-accesses 148 of FIGS. 1 and 2) from addressable bytes of the storage to the first peripheral responsive to a status request (e.g., communication 136 of FIGS. 1 and 2) from the first peripheral, valid current data CRC checksum results, and valid updated current CRC checksum results if any. In some example embodiments, the IC provides status bits (e.g., the status bits resulting from read-accesses 148 of FIGS. 1 and 2) from addressable bytes of the storage to the second peripheral responsive to a status request (e.g., communication 138 of FIGS. 1 and 2) from the second peripheral, valid current data CRC checksum results, and valid updated current CRC checksum results if any.

Without limiting other example embodiments, secure storage logic (e.g., the secure storage logic 110 of FIG. 1, the secure storage logic 110A of FIG. 2, or the secure storage logic 110B of FIG. 3) may include a register map (e.g., the register map 112 of FIGS. 1 and 2, or the register map segments 308A-308E of FIG. 3) divided into bytes, with a checksum value for each byte stored in an unexposed internal register (e.g., the CRC logic 314A-314E includes the unexposed internal register to store CRC bytes). In some example embodiments, the secure storage logic may include a read multiplexer (e.g., the read multiplexer 306 of FIG. 3), which selects a segment, based on the address most significant bit (MSB) of the to-be-updated data-byte. Also, secure storage logic may include current data CRC engine logic (e.g., the current data CRC engine logic 324 of FIG. 3, referred to as CRC8_128 Engine_Current), which: performs CRC operations on designated segments (such as each 128-bit segment) of the register map to calculate the checksum of the current data in a segment; and compare that calculated value with the checksum value stored in the internal register.

In some example embodiments, the secure storage logic includes a data multiplexer (e.g., the data multiplexer 320 of FIG. 3), which creates a merge of the current not-to-be-updated data-bytes and the next to-be-updated data-byte, based on the address least significant bit (LSB) of the to-be-updated byte in the segment. In some example embodiments. the secure storage logic includes updated data CRC Engine logic (e.g., the updated data CRC Engine logic 328 of FIG. 3, referred to as CRC8_128 Engine_Next), which performs the Cyclic Redundancy Check on the merged data. Further, the secure storage logic may include a CRC multiplexer (e.g., the CRC multiplexer 316 of FIG. 3), which: selects the current data CRC value from the unexposed internal register of a selected segment; and stores the new calculated checksum in the unexposed internal register (e.g., one of the CRC logic 314A-314E) of a selected segment of the register map.

In some example embodiments, the secure storage logic includes a write queue (e.g., the write queue 304 of FIG. 3), which stores the received data and destination address for the targeted data update in the register map. Also, the secure storage logic may include arbitration logic (e.g., the arbitration logic 302), which prioritizes the data updates from internal and external sources. Moreover, the secure storage logic may include additional CRC engine logic (e.g., the CRC engine logic 318 of FIG. 3, referred to as CRC16_8 Engine), which performs an initial CRC on the complete data in the register map. In some example embodiments, the checksum value for the CRC engine logic 318 comes from the original data source (such as from factory programmed non-volatile memory). The CRC engine logic 318 for the complete register map data ensures that the current data CRC engine logic 324 and the updated data CRC engine logic 328 start with correct initial data.

In some example embodiments, a secure storage logic performs operations such as: (a) from an internal or external source through arbitration logic, writing arriving data and an address in the write queue; (b) with the read multiplexer, selecting (from the register map) the segment where the write will occur, based on address MSB from the write queue; (c) with a first read buffer (e.g., the read buffer 322) in CRC8_128 Engine_Current, comparing the 128-bit old data of the target segment with the current data before the write update (i.e., the CRC8_128 Engine_Current performs a CRC on the 128-bit old data by using the current CRC8 value from the selected 128-bit segment); (d) directly after read-out of the selected 128-bit data, performing the actual write update in the addressed byte in the register map; (e) with the data multiplexer, merging the to-be-written data (e.g., 8-bit write data) with the existing read-data (e.g., 128-bit old data) by placing the new data at its targeted location in the 128-bit segment, based on the address LSB from the write queue; (f) storing the merged data in a second read buffer (e.g., the read buffer 326) in CRC8_128_Engine_New; (g) with CRC8_128_Engine_New, calculating the new CRC8 value for the target segment of the register map; (h) with the CRC multiplexer, putting the new CRC8 value in the correct target segment based on the address MSB; and (i) on the next calculation cycle after the write update, with CRC_128 Engine_Current, calculating the checksum on the new data (with the new data-byte) in the register map, and comparing that checksum with the current CRC value (calculated and put in the target segment using the preceding steps).

The described technique does not have the disadvantages of a host-managed CRC strategy that would otherwise require communications and data transfers between all hosts and a configurable IC (e.g., the IC 102 of FIG. 1, or the IC 102 of FIG. 2) whenever an update is performed. With the described technique, bit errors are continuously detected, even during data updates. The described technique tracks: data updates from multiple hosts; and all internal updates of a configurable device.

Advantageously, the described secure storage logic works with one checksum value for multiple bytes in the register map, and each host is not required to calculate a new checksum value for the data update. Also, the described secure storage logic is useful with any protection strategy applied on the communication bus between the configurable device and its external host(s). With the described solution, bit errors are continuously detected, even when the data undergoes continuous byte-by-byte updates. Accordingly, a shadow register map is unnecessary. Also, checksum calculations in each host are unnecessary to update the data in the master register map. By handling the register map integrity within the configurable device (i.e., on a low level from system point-of-view), the specifications are streamlined, and the user is unburdened. This provides a strategic advantage over other techniques that rely on the host to manage CRC operations. With the described techniques, the configurable device itself can perform updates to its data. without informing its external host(s) or any other external device(s).

Figure 4:
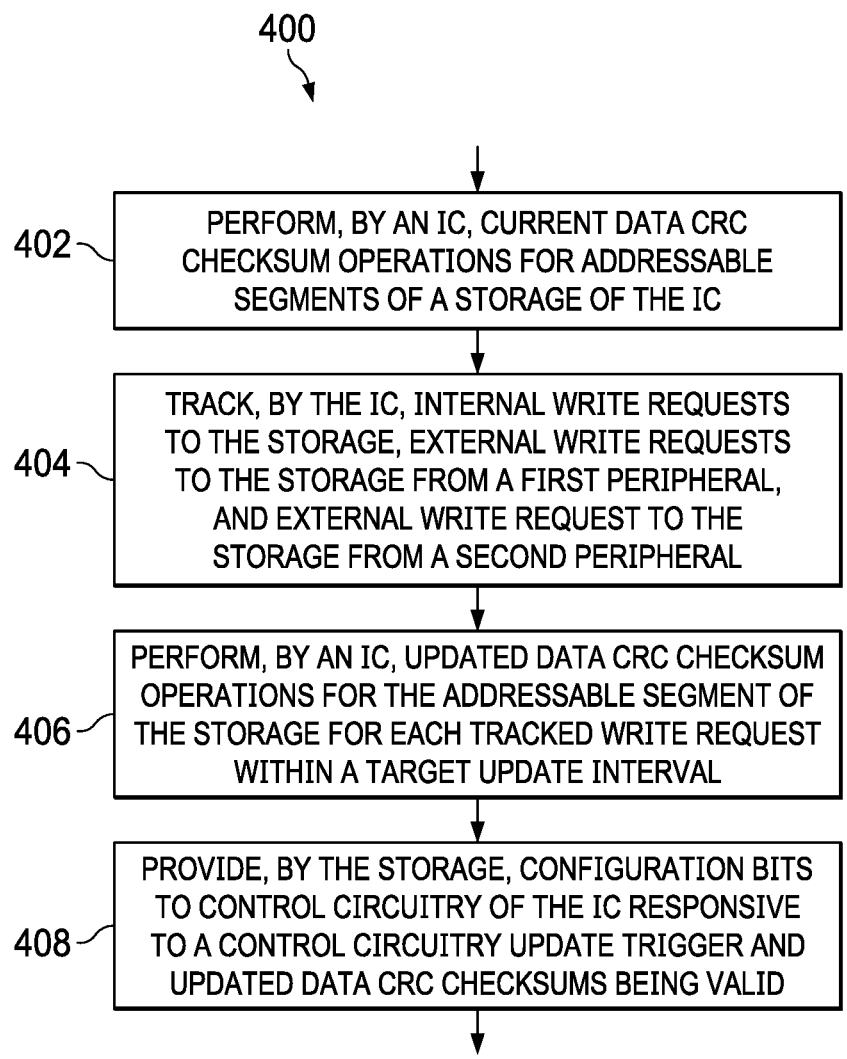
FIG. 4 is a flowchart of a method of an example embodiment.

FIG. 4 is a flowchart of a method 400 of an example embodiment. In at least one example, the method 400 is performed by a configurable IC (e.g., the IC 102 of FIG. 1, or in the IC 102A of FIG. 2) of a subsystem or system having one or more external hosts in communication with the configurable IC. As shown, the method 400 includes performing, by an IC, current data CRC checksum operations for addressable bytes of a storage of the IC at block 402. At block 404, the IC tracks internal write requests to the storage, external write requests to the storage from a first peripheral, and external write requests to the storage from a second peripheral. At block 406, within a target update interval, the IC performs updated data CRC checksum operations for the addressable bytes of the storage for each tracked write request. At block 408, configuration bits are provided by the storage to control circuitry of the IC, responsive to a control circuitry update trigger and updated data CRC checksums being valid. In different example embodiments, the control circuitry update trigger may be a scheduled update, an update performed responsive to a write operation, or other trigger.

In some example embodiments, the method 400 includes additional steps. In one example embodiment, the method 400 includes providing, by the storage, status bits to the first peripheral or the second peripheral, responsive to a status request and updated data CRC checksums being valid. Additionally or alternatively, method 400 includes adjusting, by the control circuitry, voltage converter outputs responsive to the configuration bits. Additionally or alternatively, method 400 includes adjusting, by the control circuitry, driver outputs responsive to the configuration bits. Additionally or alternatively, method 400 includes adjusting, by the control circuitry, actuator settings responsive to the configuration bits.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. An integrated circuit (IC), comprising:
   a first set of peripheral outputs, each peripheral output coupled to a respective terminal of a first set of peripheral terminals;
   a second set of peripheral outputs, each peripheral output coupled to respective terminal of a second set of peripheral terminals;
   a storage having a storage interface, the storage interface coupled to the first and second sets of peripheral outputs;
   control circuitry having control circuitry inputs and control circuitry outputs, the control circuitry inputs coupled to the storage interface and configured to receive configuration bits from the storage responsive to a control circuitry update trigger, and the control circuitry outputs coupled to the first and second sets of peripheral outputs; and
   a cyclic-redundancy check (CRC) engine coupled to the storage interface, the CRC engine configured to distinguish between purposeful updates to and bit errors in data in the storage, the CRC engine including:
   arbitration logic having arbitration logic inputs and an arbitration logic output, the arbitration logic inputs coupled to the first and second sets of peripheral terminals and an internal write request source, the arbitration logic configured to provide a write request at the arbitration logic output responsive to arbitration between internal write requests from the internal write request source, external write requests from the first set of peripheral outputs, and external write requests from the second set of peripheral outputs; and
   a write queue having a write queue input coupled to the arbitration logic output.

2. The IC of claim 1, wherein the write queue includes a first write queue output, a second write queue output, and a third write queue output, and the CRC engine includes:
   a read multiplexer having read multiplexer inputs, a read multiplexer control input, and a read multiplexer output, the read multiplexer inputs coupled to the storage interface;
   a data multiplexer having a first data multiplexer input, a second data multiplexer input, a data multiplexer control input, and a data multiplexer output, wherein the first data multiplexer input is coupled to the second write queue output, the second data multiplexer input is coupled to the read multiplexer output, and the data multiplexer control input is coupled to the first write queue output;
   CRC logic coupled to the storage interface and configured to provide a CRC checksum value for each of a set of addressable bytes;
   a CRC multiplexer having CRC multiplexer inputs, a CRC multiplexer output and a CRC multiplexer control input, the CRC multiplexer inputs coupled to the CRC logic; and
   multiplexer control circuitry having a set of multiplexer control outputs coupled to the read multiplexer control input, the CRC multiplexer control input and the data multiplexer control input, wherein the write queue includes or is coupled to the multiplexer control circuitry.

3. The IC of claim 2, wherein the CRC engine includes:
   current data CRC engine logic coupled to the CRC multiplexer output and the read multiplexer output, and including a first buffer configured to store current data CRC checksum values; and
   updated data CRC engine logic coupled to the CRC multiplexer output and the data multiplexer output, and including a second buffer configured to store updated data CRC checksum values, the updated data CRC engine logic operating in parallel with the current data CRC engine logic.

4. The IC of claim 3, wherein current data CRC checksum operations of the current data CRC engine logic, write request operations, and updated data CRC checksum operations of the updated data CRC engine logic are performed within a target update interval.

5. The IC of claim 1, wherein the IC is a power management IC (PMIC), and the control circuitry includes a first set of voltage converters and a second set of voltage converters, the first and second sets of voltage converters configured to provide respective output voltages responsive to configuration bits provided by the storage.

6. The IC of claim 1, wherein the storage is configured to:
provide configuration bits to the control circuitry responsive to a control circuitry update trigger, valid current CRC checksum results, and valid updated current CRC checksum results; and
provide status bits to the first and second sets of peripheral outputs responsive to a status request, valid current data CRC checksum results, and valid updated current CRC checksum results.

7. The IC of claim 6, wherein the control circuitry includes an adjustable sensor responsive to configuration bits from the storage.

8. The IC of claim 6, wherein the control circuitry includes an adjustable driver or actuator controller responsive to configuration bits from the storage.

9. The IC of claim 1, further comprising a state machine having state machine outputs coupled to the storage interface, the state machine configured to:
write status bits and configuration bits to the storage; and
clear status bits and configuration bits from the storage.

10. The IC of claim 1, wherein the IC is a component of an advanced driver assistance system (ADAS) domain controller.

11. A system, comprising:
a first peripheral having a first set of inputs and a first communication terminal;
a second peripheral having a second set of inputs and a second communication terminal;
an integrated circuit (IC) having:
a first set of peripheral outputs coupled to the first set of inputs;
a first peripheral terminal coupled to the first communication terminal;
a second set of peripheral outputs coupled to the second set of inputs;
a second peripheral terminal coupled to the second communication terminal;
a storage having a storage interface, the storage interface coupled to the first and second peripheral terminals and configured to provide addressable bytes;
control circuitry having control circuitry inputs and control circuitry outputs, the control circuitry inputs coupled to the storage interface and configured to receive configuration bits provided by the storage responsive to a control circuitry update trigger, and the control circuitry outputs coupled to the first and second sets of peripheral outputs; and
a cyclic-redundancy check (CRC) engine coupled to the storage interface, the CRC engine configured to:
perform current data CRC checksum operations;
track internal write requests to the storage, external write requests to the storage from the first peripheral, and external write requests to the storage from the second peripheral; and
perform updated data CRC checksum operations responsive to tracked write requests.

12. The system of claim 11, wherein the CRC engine includes:
arbitration logic having arbitration logic inputs and an arbitration logic output, the arbitration logic inputs coupled to the first peripheral terminal, the second peripheral terminal, and an internal write request source, the arbitration logic configured to provide a write request at the arbitration logic output responsive to arbitration between internal write requests from the internal write request source, external write requests from the first peripheral, and external write requests from the second peripheral; and
a write queue having a write queue input coupled to the arbitration logic output.

13. The system of claim 12, wherein the write queue includes a first write queue output, a second write queue output, and a third write queue output, and the CRC engine includes:
a read multiplexer having read multiplexer inputs, a read multiplexer control input, and a read multiplexer output, the read multiplexer inputs coupled to the storage interface;
a data multiplexer having a first data multiplexer input, a second data multiplexer input, a data multiplexer control input, and a data multiplexer output, the first data multiplexer input coupled to the second write queue output, the second data multiplexer input coupled to the read multiplexer output, and the data multiplexer control input coupled to the first write queue output;
CRC logic coupled to the storage interface and configured to provide CRC checksum values for each of the addressable bytes;
a CRC multiplexer having CRC multiplexer inputs, a CRC multiplexer output, and a CRC multiplexer control input, the CRC multiplexer inputs coupled to the CRC logic; and
multiplexer control circuitry having a set of multiplexer control outputs coupled to the read multiplexer control input, the CRC multiplexer control input, and the data multiplexer control input, in which the write queue includes or is coupled to the multiplexer control circuitry.

14. The system of claim 13, wherein the CRC engine includes:
current data CRC engine logic coupled to the CRC multiplexer output and the read multiplexer output, and including a first buffer configured to store current data CRC checksum values; and
updated data CRC engine logic coupled to the CRC multiplexer output and the data multiplexer output, and including a second buffer configured to store updated data CRC checksum values, the updated data CRC engine logic operating in parallel with the current data CRC engine logic.

15. The system of claim 11, wherein the IC is configured to:
provide configuration bits from the storage to the control circuitry responsive to a control circuitry update trigger for the control circuitry, valid current CRC checksum results, and valid updated current CRC checksum results; and
provide status bits from the storage to the first peripheral responsive to a status request from the first peripheral, valid current data CRC checksum results, and valid updated current CRC checksum results; and
provide status bits from the storage to the second peripheral responsive to a status request from the second peripheral, valid current data CRC checksum results, and valid updated current CRC checksum results.

16. The system of claim 11, wherein the IC includes a state machine having state machine outputs coupled to the storage interface, the state machine configured to:
write status bits and configuration bits to the storage; and
clear status bits and configuration bits from the storage.

17. The system of claim 11, wherein the IC, the first peripheral, and the second peripheral are components of an advanced driver assistance system (ADAS) domain controller.

18. A method, comprising:
performing, by an integrated circuit (IC), current data CRC checksum operations for addressable bytes of a storage of the IC;
tracking, by the IC, internal write requests to the storage, external write requests to the storage from a first peripheral, and external write requests to the storage from a second peripheral;
performing, by the IC, updated data CRC checksum operations for the addressable bytes of the storage for each tracked write request within a target update interval; and
providing, by the storage, configuration bits to control circuitry of the IC responsive to a control circuitry update trigger and updated data CRC checksums being valid.

19. The method of claim 18, further comprising providing, by the storage, status bits to the first peripheral or the second peripheral responsive to a status request and updated data CRC checksums being valid.

20. The method of claim 18, further comprising adjusting voltage converter outputs responsive to the configuration bits.

21. The method of claim 18, further comprising adjusting driver outputs responsive to the configuration bits.

22. The method of claim 18, further comprising adjusting actuator settings responsive to the configuration bits.

\* \* \* \* \*